United States Patent
Maehara (10) Patent No.: US 10,249,733 B2
(45) Date of Patent: Apr. 2, 2019

(54) TRANSISTOR AND MANUFACTURING METHOD OF TRANSISTOR

(71) Applicant: FUJIFILM Corporation, Tokyo (JP)

(72) Inventor: Yoshiki Maehara, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 36 days.

(21) Appl. No.: 15/709,577

(22) Filed: Sep. 20, 2017

(65) Prior Publication Data

US 2018/0006136 A1    Jan. 4, 2018

Related U.S. Application Data (63) Continuation of application No. PCT/JP2016/059572, filed on Mar. 25, 2016.

(30) Foreign Application Priority Data

Mar. 25, 2015  (JP) ................................ 2015-063065

(51) Int. Cl.
*H01L 29/66* (2006.01)
*H01L 21/311* (2006.01)
*H01L 29/423* (2006.01)
*H01L 29/786* (2006.01)
*H01L 51/05* (2006.01)

(52) U.S. Cl.
CPC .. *H01L 29/66742* (2013.01); *H01L 21/31105* (2013.01); *H01L 29/42356* (2013.01); *H01L 29/78696* (2013.01); *H01L 51/0558* (2013.01)

(58) Field of Classification Search
CPC ................................ H01L 29/66; H01L 51/05
USPC .................................................... 252/301.16
See application file for complete search history.

(56) References Cited

U.S. PATENT DOCUMENTS

| 2005/0212014 A1 | 9/2005 | Horibe et al. |
| 2007/0178616 A1 | 8/2007 | Arai et al. |
| 2014/0191224 A1 | 7/2014 | Takeya et al. |

FOREIGN PATENT DOCUMENTS

| JP | 2005-285822 A | 10/2005 |
| JP | 2007-129007 A | 5/2007 |
| JP | 2013-038127 A | 2/2013 |
| JP | 2013-253010 A | 12/2013 |

OTHER PUBLICATIONS

International Search Report issued in PCT/JP2016/059572; dated Jun. 14, 2016; with English Translation.
Written Opinion of the International Searching Authority issued in PCT/JP2016/059572; dated Jun. 14, 2016; with English Translation.

*Primary Examiner* — Edward M Johnson
(74) *Attorney, Agent, or Firm* — Studebaker & Brackett PC (57) ABSTRACT

Provided are an air up type transistor which has high electrical connection reliability and high productivity, and is capable of exhibiting good transistor characteristics while achieving microfabrication, and a manufacturing method of a transistor. A semiconductor layer is formed on an upper surface of a support precursor layer which becomes a semiconductor layer support and then a part of the semiconductor layer is removed to form one or more opening portions from which the support precursor layer is exposed. Two etching protective layers are formed on the semiconductor layer such that the two etching protective layers are separated from each other and at least a part of the opening portion is positioned in a region between the two etching protective layers. A part of the support precursor layer is removed by bringing an etchant into contact with the support precursor layer through the plurality of opening portions, thereby forming a space at a position corresponding to a region between the two etching protective layers so as to form two semiconductor layer supports that are arranged with the space interposed therebetween.

15 Claims, 6 Drawing Sheets

TRANSISTOR AND MANUFACTURING METHOD OF TRANSISTOR

CROSS-REFERENCE TO RELATED APPLICATIONS

This application is a Continuation of PCT International Application No. PCT/JP2016/059572 filed on Mar. 25, 2016, which claims priority under 35 U.S.C. § 119(a) to Japanese Patent Application No. 2015-063065 filed on Mar. 25, 2015. The above application is hereby expressly incorporated by reference, in its entirety, into the present application.

BACKGROUND OF THE INVENTION

1. Field of the Invention

The present invention relates to a transistor and a manufacturing method of a transistor.

2. Description of the Related Art

A thin film transistor (TFT) has been used in a display, a solid image pickup element, a transistor circuit, a radio frequency identifier (RFID), and the like. In particular, it is expected that a TFT using a coating type semiconductor can prepare a large-area TFT at a low cost by using a printing step together.

A structure of a TFT includes various forms according to an arrangement position of a gate electrode, and a source electrode and a drain electrode. In particular, in a bottom gate and bottom contact structure in which both of the gate electrode, and the source electrode and the drain electrode are arranged on an underlayer of a semiconductor layer, an electrode or an insulating film can be formed first on a substrate, and thus, the bottom gate and bottom contact structure becomes a structure in which productivity is high without deterioration in properties of a semiconductor due to a high temperature process or a solution process.

A TFT of the related art having a bottom gate and bottom contact structure is prepared by the following processes.

First, a gate electrode is formed on a smooth substrate. The gate electrode can be formed as an electrode having a desired pattern by photolithography in which film formation is performed with respect to a low resistance metal such as silver, gold, and aluminum, a pattern is formed by performing coating, exposure, and development with respect to a photoresist, and an unnecessary metal is removed by etching. In addition, an unnecessary portion is directly irradiated with a laser without using a photoresist, and an unnecessary metal is removed by ablation, and thus, a gate electrode having a desired pattern can be formed. Alternatively, as described in JP2007-129007A, a liquid-like conductive material such as a silver nano ink is fowled in a desired pattern by printing, and a gate electrode can be formed by a heat treatment or the like.

Next, an insulating film is formed on the substrate on which the gate electrode is formed. The insulating film is a dense film of an inorganic material such as SiOx or AlOx, and can be formed by vapor phase film deposition such as sputtering, a chemical vapor phase deposition (CVD) method, and an atomic layer deposition (ALD) method. Alternatively, the insulating film can be formed by attaching the organic material onto the substrate by coating or printing, and by curing the organic material attached onto the substrate with light or heat.

In addition, in a case where a circuit is formed of a plurality of TFTs, it is necessary that the insulating film includes a through hole in order to connect a gate electrode of one element with a source electrode or a drain electrode of the other element. The through hole can be formed by performing photolithography or laser ablation with respect to the insulating film formed on the entire surface. Alternatively, it is also possible that a photosensitive insulating film is formed, and is patterned by exposure, and both a negative film in which an exposed portion is dissolved and a positive film in which an unexposed portion is dissolved can be used.

Further, a source electrode and a drain electrode are formed on the insulating film. A formation method can be performed by the same method as that of the gate electrode. In a case where a circuit is prepared by connecting the source electrode or the drain electrode to the gate electrode, connect wiring with respect to the gate electrode is formed in a step of forming the source electrode and the drain electrode.

After that, a semiconductor is formed on the formed electrode, and is patterned, and as necessary, a protective film or the like is formed, and thus, a TFT is prepared.

Thus, in the TFT of the related art having a bottom gate and bottom contact structure, the semiconductor is formed on the insulating film.

Here, in a case where the semiconductor is formed on the insulating film, a channel is formed on the interface of the semiconductor on the insulating film side. However, the insulating film has a substance or a structure which inhibits charge movement, and thus, mobility decreases. In addition, in a case where an organic semiconductor is formed by coating, crystals are disordered according to the shape or the substance of the surface of the insulating film, and thus, the mobility decreases. In addition, foreign substances are mixed in between the semiconductor and the insulating film, and the charge movement is inhibited, or the crystals of the organic semiconductor are disordered, and thus, the mobility decreases.

In contrast, in JP2013-38127A, an air gap type organic transistor including a pair of insulating pedestals which are arranged on a substrate by being spaced from each other and respectively form a pedestal-like flat surface, a source electrode disposed on one pedestal-like flat surface, a drain electrode disposed on the other pedestal-like flat surface, a gate electrode disposed on the substrate between the pair of pedestals, and an organic semiconductor layer disposed in contact with upper surfaces of the source electrode and the drain electrode, in which the gate electrode and a lower surface of the organic semiconductor layer face to each other in a vertical direction with a gap region interposed therebetween, is disclosed.

The air gap type organic transistor has a structure in which the gap region (a space) between the gate electrode and the lower surface of the organic semiconductor layer is used as an insulating layer. Accordingly, it is disclosed that a decrease in mobility due to the shape or the substance of the surface of the insulating film can be prevented.

SUMMARY OF THE INVENTION

In such an air gap type organic transistor, in order to secure a gap region it is necessary to prepare an air gap type organic transistor by forming a gate electrode, a source electrode, a drain electrode, and the like on a substrate, and then laminating a plate-like organic semiconductor crystal that is separately formed on the upper surfaces of the drain electrode and the source electrode, which become supports for the organic semiconductor crystal.

However, in a case of laminating the organic semiconductor crystal that is separately formed on the electrodes, there is a problem that high alignment accuracy cannot be achieved and microfabrication is difficult or productivity is deteriorated.

In addition, the configuration in which the organic semiconductor crystal is laminated on the source electrode and the drain electrode using the source electrode and the drain electrode as supports is merely for physically adsorbing the organic semiconductor crystal, and thus, there are problems of low electrical connection reliability and low transistor characteristics.

The present invention has been made for solving such problems of the technology of the related art, and an object of the present invention is to provide an air gap type transistor which has high electrical connection reliability and high productivity and is capable of exhibiting good transistor characteristics while achieving microfabrication, and a manufacturing method of a transistor.

As a result of intensive studies of the present inventors, it has been found that the problems described above can be solved by forming a semiconductor layer on an upper surface of a support precursor layer which becomes a semiconductor layer support, then forming one or more opening portions from which the support precursor layer is exposed by removing a part of the semiconductor layer, forming two etching protective layers on the semiconductor layer such that the two etching protective layers are separated from each other and at least a part of the opening portions is positioned in a region between the two etching protective layers, and then removing a part of the support precursor layer by bringing a liquid or a gas that can etch the support precursor layer into contact with the support precursor layer through the opening portions between the two etching protective layers, thereby forming a space at a position corresponding to the region between the two etching protective layers so as to form two semiconductor layer supports that are arranged with the space interposed therebetween.

That is, it has been found that the object described above can be attained by the following configurations.

(1) A manufacturing method of a transistor, comprising:
a preparation step of preparing a laminate in which a gate electrode layer, a solid insulating layer, and a support precursor layer are laminated on a substrate in this order;
a semiconductor layer forming step of forming a semiconductor layer on an upper surface of the support precursor layer of the laminate;
an opening portion forming step of forming one or more opening portions from which the support precursor layer is exposed by removing a part of the semiconductor layer;
a protective layer forming step of forming two etching protective layers on the semiconductor layer such that the two etching protective layers are separated from each other and at least a part of the opening portion is positioned in a region between the two etching protective layers; and
a support forming step of removing a part of the support precursor layer by bringing a liquid or a gas that can etch the support precursor layer into contact with the support precursor layer through the opening portions between the two etching protective layers, thereby forming a space at a position corresponding to the region between the two etching protective layers so as to form two semiconductor layer supports that are arranged with the space interposed therebetween.

(2) The manufacturing method of a transistor according to (1), in which the support precursor layer is formed of a metal or a metal oxide.

(3) The manufacturing method of a transistor according to (1) or (2), in which the two semiconductor layer supports formed in the support forming step are a source electrode and a drain electrode.

(4) The manufacturing method of a transistor according to any one of (1) to (3),
in which in the opening portion forming step, two or more opening portions are formed to be arranged in one direction,
in the protective layer forming step, two etching protective layers that extend in the arrangement direction of the two or more opening portions are formed to be separated from each other in a direction orthogonal to the arrangement direction of the two or more opening portions, and
in the support forming step, the two semiconductor layer supports are formed by removing the support precursor layer at a position corresponding to a region in which the two or more opening portions are arranged between the two etching protective layers and forming the space.

(5) The manufacturing method of a transistor according to any one of (1) to (4), in which in the opening portion forming step, the semiconductor layer is divided into a plurality of portions arranged in one direction, and the opening portion is formed between the divided semiconductor layers.

(6) The manufacturing method of a transistor according to any one of (1) to (5), in which in the semiconductor layer forming step, a coating solution which becomes the semiconductor layer is applied to the upper surface of the support precursor layer of the laminate, and is dried to form the semiconductor layer.

(7) The manufacturing method of a transistor according to any one of (1) to (6), in which in the opening portion forming step, a part of the semiconductor layer is removed by laser processing.

(8) The manufacturing method of a transistor according to any one of (1) to (7), further comprising:
an insulating layer removing step of removing the solid insulating layer at a position corresponding to the space between the two semiconductor layer supports, after the support forming step.

(9) A transistor, comprising:
a substrate;
a gate electrode layer that is laminated on the substrate;
a solid insulating layer that is laminated on the gate electrode layer;
two semiconductor layer supports that are laminated on the solid insulating layer; and
a plurality of semiconductor layers that are laminated on the two semiconductor layer supports,
in which the plurality of semiconductor layers are arranged to be separated from each other in a first direction and an opening portion is formed between the plurality of semiconductor layers, and
the two semiconductor layer supports are arranged to be separated from each other in a second direction orthogonal to the first direction and a gap region is formed between the semiconductor layer and the solid insulating layer and between the two semiconductor layer supports.

According to the present invention, it is possible for an air gap type transistor to achieve high electrical connection reliability and high productivity and to exhibit good transistor characteristics while achieving microfabrication.

DESCRIPTION OF THE PREFERRED EMBODIMENTS

Hereinafter, the present invention will be described in detail.

The description of the following configuration requirements is based on representative embodiments of the present invention, but the present invention is not limited to such embodiments.

Furthermore, in the present specification, a numerical range denoted by using "to" indicates a range including numerical values before and after "to" as the lower limit value and the upper limit value.

[Transistor]

A transistor of the present invention prepared by a manufacturing method of a transistor of the present invention (hereinafter, also referred to as a "manufacturing method of the present invention") is a transistor including a substrate, a gate electrode layer that is laminated on the substrate, a solid insulating layer that is laminated on the gate electrode layer, two semiconductor layer supports that are laminated on the solid insulating layer, and a plurality of semiconductor layers that are laminated on the two semiconductor layer supports, in which the plurality of semiconductor layers are arranged to be separated from one another in a first direction, a plurality of opening portions are each formed between the semiconductor layers, the two semiconductor layer supports are arranged to be separate from each other in a second direction orthogonal to the first direction, and a gap region is formed between the semiconductor layer and the solid insulating layer and between the two semiconductor layer supports.

The transistor of the present invention is a field effect transistor (FET) and can suitably function as a so-called thin film transistor (TFT).

Next, the configuration of the transistor of the present invention will be described using FIG. 1 and FIG. 2A to FIG. 2C.

Figure 1:
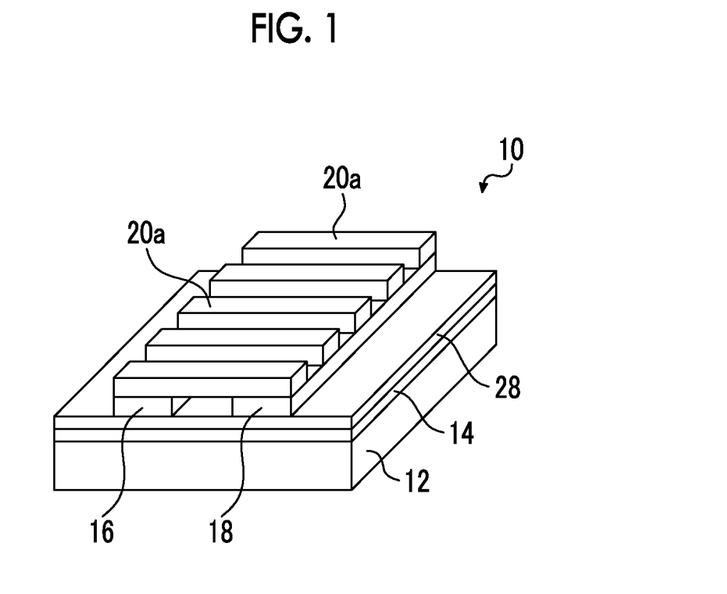
FIG. 1 is a schematic perspective view schematically showing an example of a thin film transistor prepared by a manufacturing method of a transistor of the present invention.
Figure 2A:
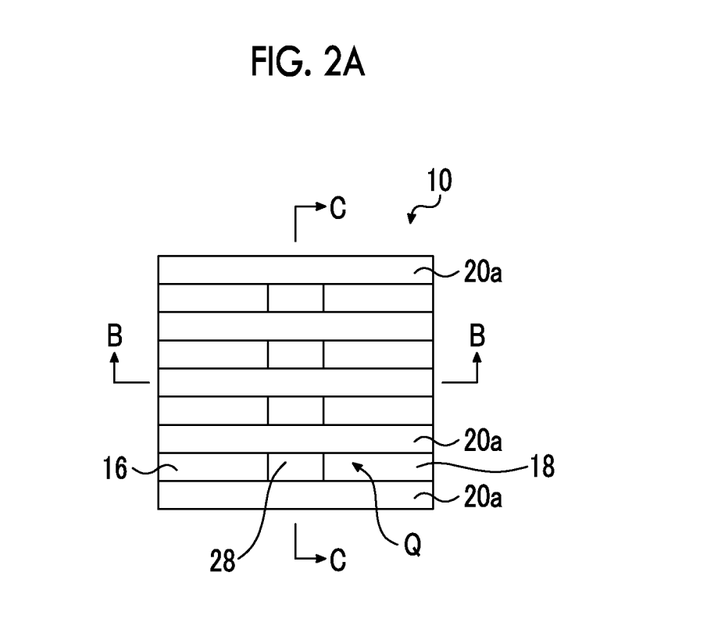
FIG. 2A is a top view of the thin film transistor of FIG. 1.
Figure 2B:
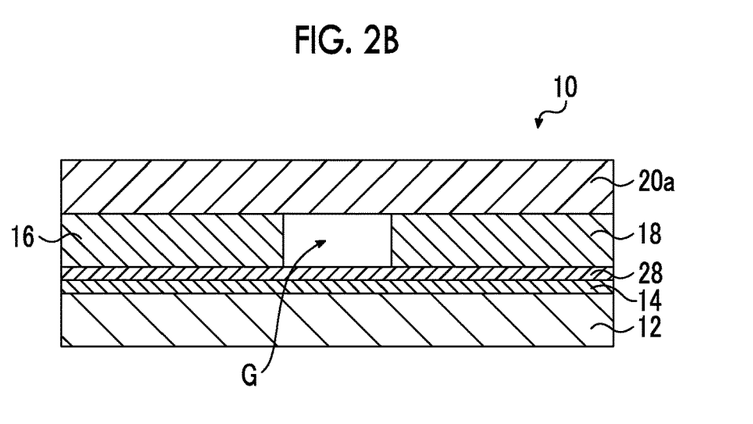
FIG. 2B is a cross-sectional view taken along line B-B of FIG. 2A.
Figure 2C:
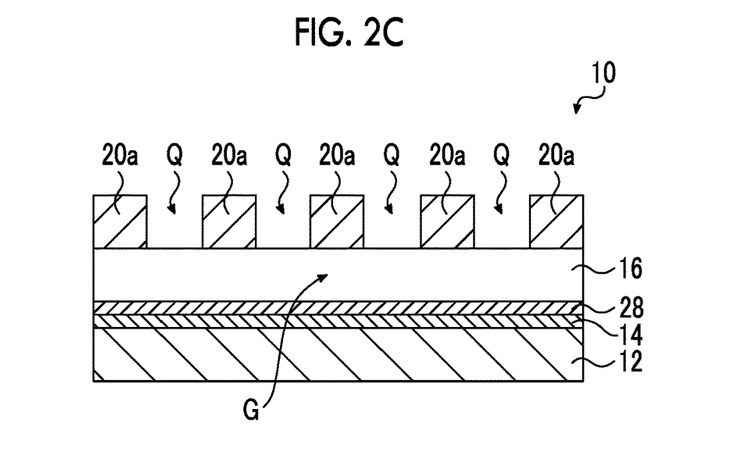
FIG. 2C is a cross-sectional view taken along line C-C of FIG. 2A.

FIG. 1 is a schematic perspective view showing an example of a suitable embodiment of the transistor of the present invention, FIG. 2A is a top view of the transistor of FIG. 1, FIG. 2B is a cross-sectional view taken along line B-B of FIG. 2A, and FIG. 2C is a cross-sectional view taken along line C-C of FIG. 2A.

As shown in FIG. 1 and FIG. 2A to FIG. 2C, a transistor 10 includes a substrate 12, a gate electrode layer 14, a solid insulating layer 28, a source electrode 16, a drain electrode 18, and a plurality of semiconductor layers 20a. In addition, the transistor 10 is a so-called bottom gate and bottom contact type thin film transistor in which the gate electrode layer 14, the source electrode 16, and the drain electrode 18 are formed on an underlayer of the semiconductor layers 20a (on the substrate 12 side).

In addition, the source electrode 16 and the drain electrode 18 are semiconductor layer supports in the present invention.

In FIG. 2A to FIG. 2C, only a region in which the source electrode 16 and the drain electrode 18 are formed and the semiconductor layers 20a are laminated thereon is shown.

The substrate 12 is a plate-like support that supports the gate electrode layer 14, the solid insulating layer 28, and the like.

The gate electrode layer 14 is a member having high conductivity and is formed on the entire are of one surface of the substrate 12.

The solid insulating layer 28 has insulating properties and is formed to cover the gate electrode layer 14. In addition, an upper surface of the solid insulating layer 28 is smoothly formed.

The source electrode 16 and the drain electrode 18 are members having high conductivity and are formed on the solid insulating layer 28. In a case of viewing the source electrode and the drain electrode in a direction perpendicular to a main surface of the substrate 12, the source electrode 16 and the drain electrode 18 are respectively formed into a rectangular shape extending in the first direction (in the vertical direction in FIG. 2A) and are arranged to be separated from each other by a predetermined distance in the second direction (the horizontal direction in FIG. 2A) orthogonal to the first direction.

In addition, the source electrode 16 and the drain electrode 18 have approximately the same thickness and the plurality of semiconductor layers 20a are laminated on the upper surfaces of the source electrode 16 and the drain electrode 18. That is, the source electrode 16 and the drain electrode 18 have a function of supporting the semiconductor layers 20a.

Furthermore, a distance between the source electrode 16 and the drain electrode 18 is a channel length in the transistor 10 and the distance is preferably 0.1 µm to 10,000 µm, is more preferably 1 µm to 1,000 µm, and is particularly preferably 10 µm to 500 µm.

In a case where the distance between the source electrode 16 and the drain electrode 18 excessively decreases, an influence of contact resistance increases, and mobility as an element decreases, or a high accuracy is required at the time of being prepared, and thus, productivity decreases. Accordingly, it is preferable that the distance is greater than or equal to 0.1 µm from the viewpoint of preventing a decrease in the mobility and of the productivity. In contrast, in a case where the distance between the source electrode 16 and the drain electrode 18 excessively increases, a current between electrodes decreases, and thus, element properties are degraded. Accordingly, it is preferable that the distance is less than or equal to 10,000 µm from the viewpoint of the element properties.

In addition, in the following description, in a case where it is not necessary to distinguish the gate electrode layer 14, the source electrode 16, and the drain electrode 18 from each other, the gate electrode layer 14, the source electrode 16, and the drain electrode 18 will be simply referred to as an "electrode".

The plurality of semiconductor layers 20a are respectively active layers each formed of a semiconductor. As shown in FIG. 1 and FIG. 2B, the plurality of semiconductor layers 20a are respectively formed into the shape of a plate, one end portion is laminated on the upper surface of the source electrode 16, and the other end portion is laminated on the upper surface of the drain electrode 18. In addition, in a region between the source electrode 16 and the drain electrode 18, the semiconductor layer 20a is separated from the solid insulating layer 28 by a predetermined distance in a direction perpendicular to the main surface of the substrate 12. That is, a space is formed between the semiconductor layer 20a and the solid insulating layer 28 and between the source electrode 16 and the drain electrode 18. The space is a gap region G in the present invention.

In addition, as shown in FIG. 2A and FIG. 2C, the plurality of semiconductor layers 20a are respectively formed into a rectangular shape extending in a direction in which the source electrode 16 and the drain electrode 18 are arranged, that is, in the second direction. Further, the plurality of semiconductor layers 20a are arranged in the first direction orthogonal to the second direction with predetermined intervals. That is, in the plurality of semiconductor layers 20a, opening portions Q are each formed between the arranged semiconductor layers 20a. Moreover, as shown in FIG. 2C, the opening portion Q and the gap region G communicate with each other.

The gap region G and the opening portion Q may be in vacuum or may be filled with a gas. Nitrogen, moisture vapor, helium, neon, argon, krypton, xenon, radon, and the like are exemplified as the gas. Alternatively, the gap region G may be filled with a liquid having insulating properties, such as an organic solvent, an electrolyte, and an ion liquid. In addition, the gap region G may be filled with a mixture thereof. The configuration of the transistor in which the gap region G is filled with an electrolyte and an ion liquid is called an electric double layer transistor (EDLT).

The height of the gap region G is not particularly limited, but is preferably 10 nm to 20,000 nm, is more preferably 100 nm to 5,000 nm, and is particularly preferably 200 nm to 2,000 nm, from the viewpoint of the insulating properties, the voltage applying properties, and the like.

[Manufacturing Method of Transistor]

Next, a manufacturing method of a transistor of the present invention will be described.

The manufacturing method of a transistor of the present invention is a manufacturing method of a transistor including a preparation step of preparing a laminate in which a gate electrode layer, a solid insulating layer, and a support precursor layer are laminated on a substrate in this order, a semiconductor layer forming step of forming a semiconductor layer on an upper surface of the support precursor layer of the laminate, an opening portion forming step of forming one or more opening portions from which the support precursor layer is exposed by removing a part of the semiconductor layer, a protective layer forming step of forming etching protective layers on the semiconductor layer such that two etching protective layers are separated from each other and at least a part of the opening portion is positioned in a region between the two etching protective layers, and a support forming step of removing a part of the support precursor layer by bringing a liquid or a gas that can etch the support precursor layer into contact with the support precursor layer through the opening portions between the two etching protective layers, thereby forming a space at a position corresponding to the region between the two etching protective layers so as to form two semiconductor layer supports that are arranged with the space interposed there between.

Next, each of the steps of the manufacturing, method of the present invention will be described by using FIG. 3A to FIG. 6B.

[Preparation Step]

Figure 3A:
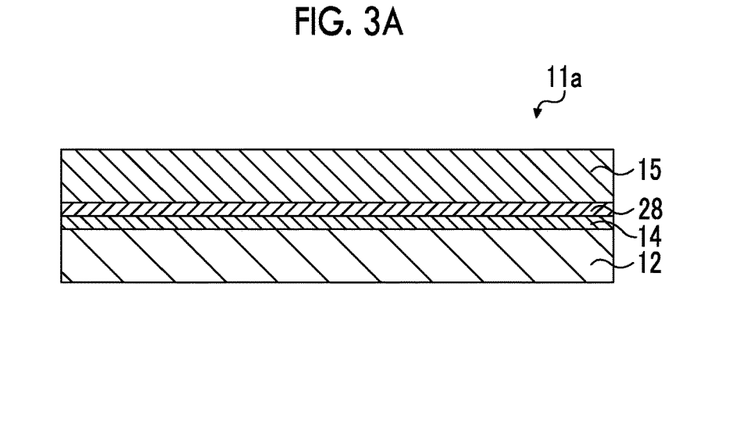
FIG. 3A is a schematic cross-sectional view of an example of a laminate prepared in a preparation step.

The preparation step is a step of preparing a laminate 11a in which the gate electrode layer 14, the solid insulating layer 28, and the support precursor layer 15 are laminated on the substrate 12 in this order as shown in FIG. 3A.

(Substrate)

The material, the shape, the size, the structure, and the like of the substrate are not particularly limited, but can be suitably selected according to the purpose.

A substrate formed of an inorganic material such as glass and yttria-stabilized zirconia (YSZ), a resin, a resin composite material, or the like can be used as the material of the substrate.

Among them, a substrate formed of the resin or the resin composite material is preferable from the viewpoint of lightweight, of having flexibility, and of having light transmittance.

Specifically, a substrate formed of a synthetic resin such as polybutylene terephthalate, polyethylene terephthalate, polyethylene naphthalate, polybutylene naphthalate, polystyrene, polycarbonate, polysulfone, polyether sulfone, polyarylate, allyl diglycol carbonate, polyamide, polyimide, polyamide imide, polyether imide, polybenzazole, polyphenylene sulfide, polycycloolefin, a norbornene resin, a fluorine resin such as polychlorotrifluoroethylene, a liquid crystal polymer, an acrylic resin, an epoxy resin, a silicone resin, an ionomer resin, a cyanate resin, crosslinked fumaric acid diester, cyclic polyolefin, aromatic ether, maleimide olefin, cellulose, and an episulfide compound, a substrate formed of a composite plastic material between the synthetic resin described above or the like and silicon oxide particles, a substrate formed of a composite plastic material between the synthetic resin described above or the like and metal nano particles, inorganic oxide nano particles, inorganic nitride nano particles, or the like, a substrate formed of a composite plastic material between the synthetic resin described above or the like and a carbon fiber or a carbon nano tube, a substrate formed of a composite plastic material between the synthetic resin described above or the like and a glass flake, a glass fiber, or glass beads, a substrate formed of a composite plastic material between the synthetic resin described above or the like and a clay mineral or particles having a crystal structure derived from mica, a laminated plastic substrate including a junction interface between thin glass and any one of the synthetic resins described above at least once, a substrate formed of a composite material having barrier performance which includes a junction interface at least once by alternately laminating an inorganic layer and an organic layer (the synthetic resin described above), a stainless steel substrate or a metal multilayer substrate in which stainless steel and a dissimilar metal are laminated, an aluminum substrate or an aluminum substrate with an oxide film in which a surface is subjected to an oxidization treatment (for example, an anode oxidization treatment), and thus, insulating properties of the surface are improved, and the like can be used.

Furthermore, it is preferable that a resin substrate has excellent heat resistance, excellent dimensional stability, excellent solvent resistance, excellent electrical insulating properties, excellent workability, low air permeability, and low hygroscopicity. The resin substrate may include a gas barrier layer for preventing permeation of moisture or oxygen, an undercoat layer for improving smoothness of the resin substrate or adhesiveness with respect to a lower electrode, and the like.

The thickness of the substrate is not particularly limited and may be appropriately set according to the application of the transistor.

(Gate Electrode Layer)

A formation material of the gate electrode layer is not particularly limited insofar as having high conductivity, and various known formation materials of an electrode which is used in a thin film transistor of the related art can be used.

Specifically, a metal such as Ag, Au, Al, Cu, Pt, Pd, Zn, Sn, Cr, Mo, Ta, and Ti, Al—Nd, and a metal oxide such as, tin oxide, zinc oxide, indium oxide, indium tin oxide (ITO), and indium zinc oxide (IZO), a conductive polymer such as polyethylene dioxythiophene-polystyrene sulfonic acid (PEDOT-PSS), and a laminate structure of these can be used.

The gate electrode layer can be formed by a method appropriately selected from methods such as printing, vacuum film formation, plating, photolithography, and laser patterning in consideration of suitability with respect to a material to be used.

In addition, in the case of considering the film formability, the patterning properties, the conductivity, and the like, the thickness of the gate electrode layer is preferably 10 nm to 1,000 nm, and is more preferably 50 nm to 200 nm.

(Solid Insulating Layer)

A formation material of the solid insulating layer is not particularly limited insofar as having high insulating properties, and various known formation materials of a solid insulating layer which is used in a transistor of the related art can be used.

Specifically, compounds having insulating properties, such as $SiO_2$, $SiN_x$, SiON, $Al_2O_3$, $Y_2O_3$, $Ta_2O_5$, and $HfO_2$, can be used. In addition, the solid insulating layer may contain at least two of the compounds. A material containing $SiO_2$ is preferably used from the viewpoint of high insulating properties or the like.

The solid insulating layer can be formed according to a method which is suitably selected from a wet method such as a printing method and a coating method, a physical method such as a vacuum vapor deposition method, a sputtering method, and an ion plating method, a chemical method such as CVD and a plasma CVD method, and the like, in consideration of suitability with respect to a material to be used.

In addition, the solid insulating layer may be formed by being patterned into a predetermined shape by photolithography and etching.

The thickness of the solid insulating layer may be suitably set according to the formation material from the viewpoint of withstand voltage properties to be required, a reduction in an applied voltage, and the like. The thickness of the solid insulating layer is preferably from 10 nm to 10 μμm, is more preferably from 50 nm to 1,000 nm, and is particularly preferably from 100 nm to 400 nm.

(Support Precursor Layer)

The support precursor layer is formed by the source electrode and the drain electrode.

Accordingly, a formation material of the support precursor layer is not particularly limited as long as the material has high conductivity, and various known formation materials of an electrode which is used in a thin film transistor of the related art can be used.

Specifically, a metal such as Ag, Au, Al, Cu, Pt, Pd, Zn, Sn, Cr, Mo, Ta, and Ti, Al—Nd, a metal oxide such as, tin oxide, zinc oxide, indium oxide, indium tin oxide (ITO), and indium zinc oxide (IZO), a conductive polymer such as polyethylene dioxythiophene-polystyrene sulfonic acid (PEDOT-PSS), and a laminated structure of these can be used.

The support precursor layer can be fanned by a method appropriately selected from methods such as printing, vacuum film formation, plating, photolithography, and laser patterning in consideration of suitability with respect to a material to be used.

In addition, the thickness of the support precursor layer is preferably from 100 nm to 5,000 nm and is more preferably from 200 nm to 2,000 nm in the case of considering the film formability, the patterning properties, the conductivity, and the like.

The gate electrode layer and the support precursor layer may be respectively formed of different materials and may be respectively formed of the same material.

[Semiconductor Layer Forming Step]

The semiconductor layer forming step is a step of preparing a laminate 11b (FIG. 3C) by forming a semiconductor layer 20 and laminating the semiconductor layer on the support precursor layer 15 of the prepared laminate 11a.

(Semiconductor Layer)

A formation material of the semiconductor layer is not particularly limited, and various semiconductors which are used as an active layer in a known transistor of the related art can be used.

Specifically, an oxide semiconductor such as InGaZnO, a nitride semiconductor, an inorganic semiconductor such as Si and Ge, a compound semiconductor such as GaAs, a carbon nano tube, an organic semiconductor, and the like can be used.

In the present invention, the organic semiconductor is preferably used from the viewpoint of being easily prepared, having excellent bendability, and enabling to be applied.

A pentacene derivative such as 6,13-bis(triisopropyl silyl ethynyl) pentacene (TIPS pentacene), an anthradithiophene derivative such as 5,11-bis(triethyl silyl ethynyl) anthradithiophene (TES-ADT), a benzodithiophene (BDT) derivative, a benzothienobenzothiophene (BTBT) derivative such as dioctyl benzothienobenzothiophene (C8-BTBT), a dinaphthothienothiophene (DNTT) derivative, a dinaphthobenzodithiophene (DNBDT) derivative, a 6,12-dioxaanthanthrene (perixanthenoxanthene) derivative, a naphthalene tetracarboxylic acid diimide (NTCDI) derivative, a perylene tetracarboxylic acid diimide (PTCDI) derivative, a polythiophene derivative, a poly(2,5-bis(thiophen-2-yl) thieno[3,2-b]thiophene) (PBTTT) derivative, a tetracyanoquinodimethane (TCNQ) derivative, oligothiophenes, phthalocyanines, fullerenes, a polyacetylene-based conductive polymer, a polyphenylene-based conductive polymer such as polyparaphenylene and a derivative thereof, and polyphenylene vinylene and a derivative thereof, a heterocyclic conductive polymer such as polypyrrole and a derivative thereof, polythiophene and a derivative thereof, and polyfuran and a derivative thereof, an ionic conductive polymer such as polyaniline and a derivative thereof, and the like can be used as the organic semiconductor.

As a formation method of the semiconductor layer, a gas phase deposition method such as a vacuum vapor deposition method, a sputtering method, and a pulse laser vapor deposition method (PLD method), a coating method, a printing method, a transfer method, and the like can be used.

Among these, it is preferable that a liquid coating solution containing the material which becomes the semiconductor layer is prepared, applied to the semiconductor layer support, and dried to form a semiconductor layer.

Figure 3B:
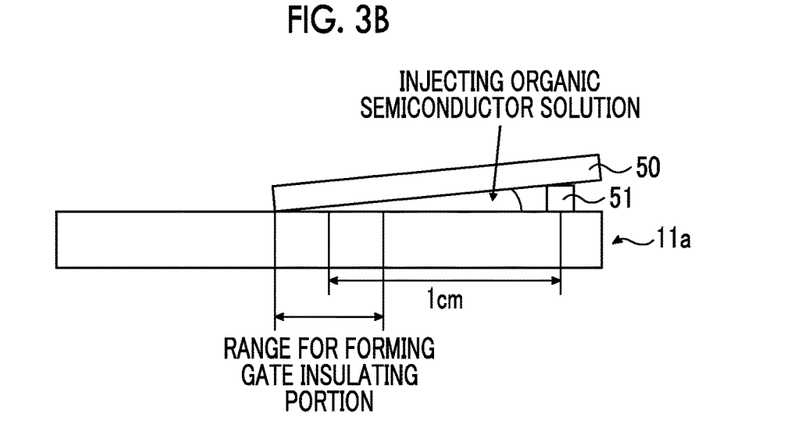
FIG. 3B is a schematic view for illustrating a semiconductor layer forming step.
Figure 3C:
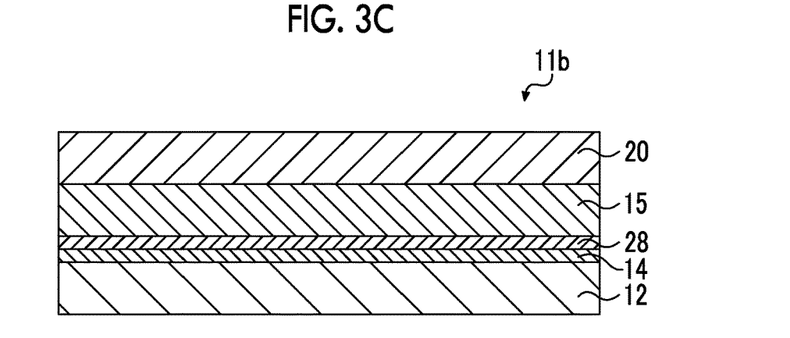
FIG. 3C is a schematic cross-sectional view showing a laminate in which a semiconductor layer is laminated.

An application method of the coating solution which becomes the semiconductor layer is not particularly limited and a known application method such as spin coating, doctor knife coating, gravure coating, dip coating, and dropwise addition of droplet can be used. As shown in FIG. 3B, as an example, a method in which a wedged solution adsorption portion is formed on the support precursor layer 15 of the laminate 11a by combining a glass piece 50 and a spacer 51, the coating solution is injected into the solution adsorption portion, a film of the coating solution is formed and dried at a tip end side (acute angle side) of the solution adsorption portion to form a thin film semiconductor layer 20 can be exemplified.

The thickness of the semiconductor layer is preferably from 1 nm to 1,000 nm and is more preferably 10 nm to 300 nm in the case of considering film formability and the like.

In addition, the semiconductor layer may be amorphous or crystalline.

[Opening Portion Forming Step]

Figure 4:
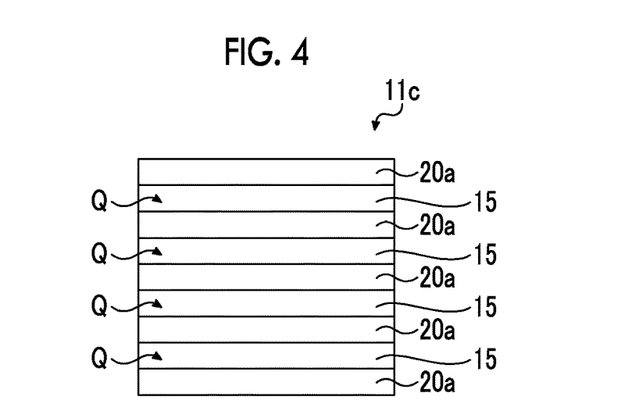
FIG. 4 is a schematic top view showing an example of a laminate in which opening portions are formed in an opening portion forming step.

The opening portion forming step is a step of forming one or more opening portions Q in the semiconductor layer 20 by removing a part of the semiconductor layer 20 of the laminate 11b to prepare a laminate 11c in which the opening portions are formed as shown in FIG. 4.

In the opening portion forming step, it is preferable to form a plurality of opening portions Q, and in a case of forming a plurality of opening portions Q, a part of the semiconductor layer 20 is removed so that the plurality of opening portions Q of the laminate 11c are arranged in one direction (first direction). In addition, in the opening portions Q, the semiconductor layer 20 is fully removed in a thickness direction and the support precursor layer 15 is exposed.

Further, as shown in FIG. 4, in the opening portion forming step, the opening portions Q may be formed to extend from one end facing the semiconductor layer 20 to the other end in a second direction and the semiconductor layer 20 may be divided into the plurality of semiconductor layers 20a. Accordingly, the plurality of semiconductor layers 20a are arranged in the first direction.

As a method of removing a part of the semiconductor layer 20 in the opening portion forming step, laser processing, photolithography, and a patterning method by etching, a rubbing treatment, a mechanical scribing method, and the like can be exemplified.

Among these, from the viewpoint of facilitating high precision fine processing, hardly damaging portions of the semiconductor layer other than a portion to be removed, and the like, laser processing is preferably used. Although the kind of laser used in the laser processing is not particularly limited, a laser having a wavelength that the support precursor layer 15 does not absorb but the semiconductor layer 20 absorbs is preferably used.

[Protective Layer Forming Step]

Figure 5A:
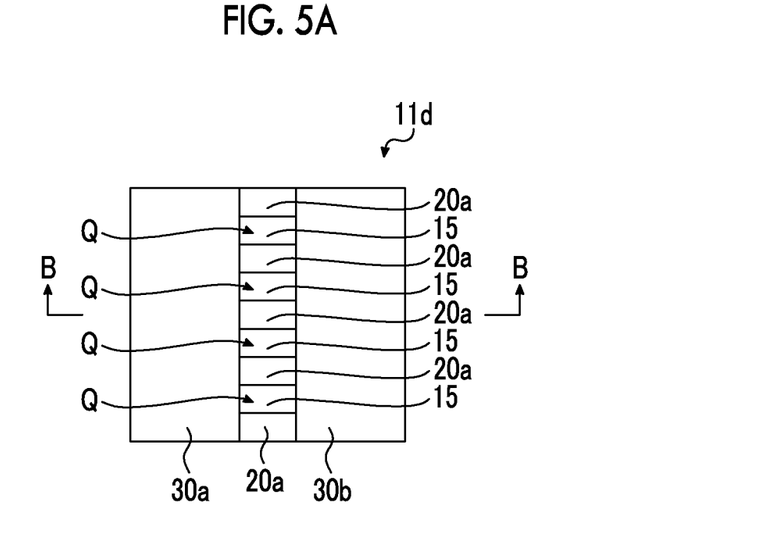
FIG. 5A is a schematic top view showing an example of a laminate in which a protective layer is formed in a protective layer forming step.
Figure 5B:
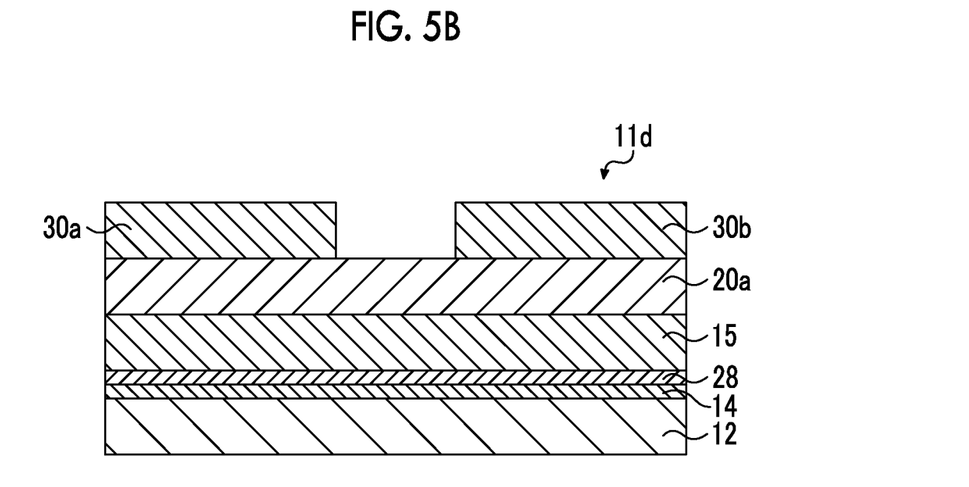
FIG. 5B is a cross-sectional view taken along line B-B of FIG. 5A.

The protective layer forming step is a step of preparing a laminate 11d in which the protective layer is formed as shown in FIG. 5A and FIG. 5B by forming two etching protective layers 30a and 30b on the semiconductor layer 20a on which the opening portion Q is formed.

The etching protective layers 30a and 30b are provided to protect regions of the support precursor layer 15 which become semiconductor layer supports in a case where the support precursor layer 15 is etched in the support forming step to be described later.

As shown in FIG. 5A and FIG. 5B, the two etching protective layers 30a and 30b extend in the first direction that is the arrangement direction of the opening portions Q and are separated from each other in the second direction orthogonal to the first direction. In addition, the etching protective layers 30a and 30b are formed such that at least a part of opening portion Q is positioned between the two etching protective layers 30a and 30b.

(Etching Protective Layer)

A formation material of the etching protective layer is not particularly limited and a material not etched with a liquid or a gas that can etch the support precursor layer may be appropriately selected.

Specifically, as the formation material of the etching protective layer, a material that is not etched can be used by appropriately selecting a material from the same materials as the aforementioned formation materials of the solid insulating layer and the aforementioned formation materials of the electrode.

In addition, the etching protective layer can be formed according to a method appropriately selected from methods such as printing, vacuum film formation, plating, photolithography, and laser patterning in consideration of suitability with respect to a material to be used.

Further, the thickness of the etching protective layer is preferably 50 nm to 5,000 nm and is more preferably 100 nm to 1,000 nm in the case of considering film formability and patterning properties.

[Support Forming Step]

Figure 6A:
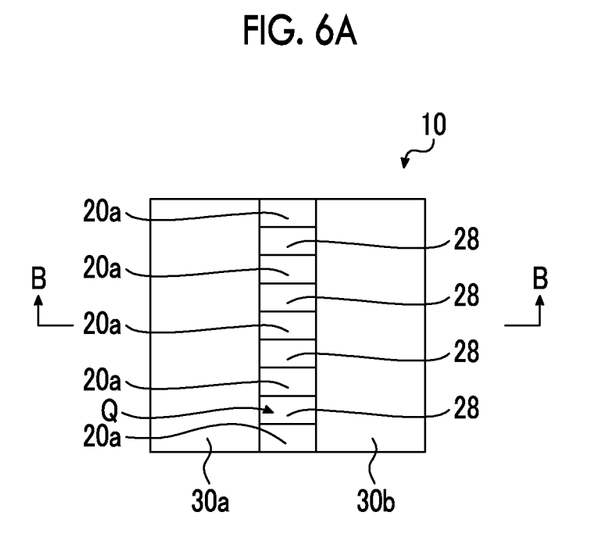
FIG. 6A is a schematic top view showing an example of the thin film transistor prepared by forming a space in a support forming step.
Figure 6B:
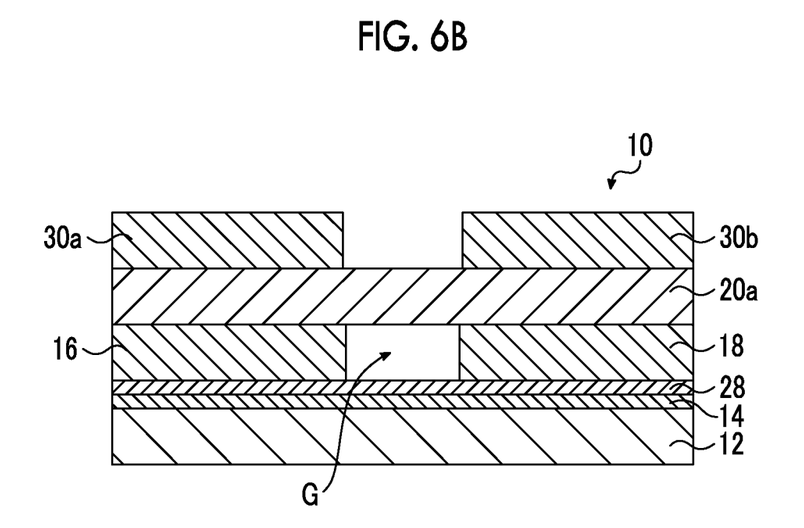
FIG. 6B is a cross-sectional view taken along line B-B of FIG. 6A.

The support forming step is a step of forming two semiconductor layer supports by etching the support precursor layer 15 and removing a part of the support precursor layer 15 so as to prepare a transistor 10 shown in FIG. 6A and FIG. 6B. As described above, the two formed semiconductor supports become the source electrode 16 and the drain electrode 18.

Specifically, a liquid or a gas that can etch the support precursor layer 15 (hereinafter, also referred to as an "etchant") is brought into contact with the support precursor layer 15 through the plurality of opening portions Q between the two etching protective layers 30a and 30b. The support precursor layer 15 in a region corresponding to the opening portions Q with which the etchant is brought into contact is removed. In this case, the support precursor layer 15 around the opening portions Q is also removed by the entrance of the etchant. Therefore, the support precursor layer 15 in the entire region in which the opening portions Q are arranged between the two etching protective layers 30a and 30b is removed. Accordingly, a space is formed at a position corresponding to the region in which the plurality of opening portions Q are arranged between the two etching protective layers 30a and 30b and the two semiconductor layer supports (source electrode 16 and drain electrode 18) that are arranged with the space interposed therebetween are formed. That is, the space becomes the gap region G.

(Etchant)

The etchant is not particularly limited and an etchant that can etch the support precursor layer without deteriorating the semiconductor layer may be appropriately selected according to the material of the semiconductor layer and the support precursor layer.

As described above, since the insulating layer and the semiconductor layer are in contact with each other in the transistor of the related art, there is a problem in that the crystals of the semiconductor layer are disordered due to the shape or substance of the surface of the insulating layer and thus mobility decreases.

Here, an air gap type transistor in which a gap region is interposed between a gate electrode and a semiconductor layer is proposed. In the air gap type transistor, since a current flows at an interface between the semiconductor layer and the gap region, a decrease in mobility caused by the shape or substance of the surface of the insulating film can be prevented.

In order to secure the gap region, such an air gap type transistor needs to be prepared in such a manner that after a gate electrode, a source electrode, a drain electrode, and the like are formed on a substrate, plate-like organic semiconductor crystals that are separately formed are laminated on the upper surfaces of the source electrode and the drain electrode which become supports for the organic semiconductor crystals.

However, in a case where the organic semiconductor crystals that are separately formed are laminated on the electrodes, there is a problem that high alignment precision cannot be achieved and thus microfabrication is hardly achieved or productivity is deteriorated.

In addition, the configuration in which the organic semiconductor crystals are laminated on the source electrode and the drain electrode using the source electrode and the drain electrode as supports is provided for only the physical adsorption of the organic semiconductor crystals and thus there are problems that electrical connection reliability is low and transistor characteristics are degraded.

In contrast, in the manufacturing method of the transistor of the present invention, the semiconductor layer is formed on the support precursor layer which becomes a semiconductor layer support, a part of the semiconductor layer is removed to form the opening portions, the etchant is brought into contact with the support precursor layer through the opening portions, and a part of the support precursor layer is removed to form the two semiconductor layer supports.

Accordingly, it is not necessary to align the semiconductor layer supports and the semiconductor layer and a transistor can be prepared with high position precision. Thus, it is possible to increase productivity while facilitating microfabrication.

In addition, since the semiconductor layer is formed directly on the support precursor layer which becomes the semiconductor layer support, it is possible to increase electrical connection reliability by increasing adhesiveness between the semiconductor layer support and the semiconductor layer and to improve transistor characteristics.

Further, since the transistor prepared by the manufacturing method of the present invention has the gap region between the gate electrode layer and the semiconductor layer, a current flows at the interface between the semiconductor layer and the gap region and thus it is possible to prevent a decrease in mobility caused by the shape or substance of the surface of the solid insulating layer.

Here, a ratio d1/d2 between a width d1 of the opening portion Q in the arrangement direction (first direction) and a distance d2 between the two etching protective layers 30*a* and 30*b* is preferably 0.001 to 10,000 and is more preferably 0.02 to 100.

In the support forming step, in a case where the support precursor layer is etched, the support precursor layer in the regions corresponding to the etching protective layers is also etched by the entrance of the etchant. In contrast, by setting the ratio d1/d2 between the width d1 of the opening portion and the distance d2 between the etching protective layers to be in this range, in the support forming step, in the case where the support precursor layer is etched, it is possible to adjust the entrance of the etchant to be appropriate and to remove the support precursor layer at the position corresponding to the region in which the plurality of opening portions are arranged between the two etching protective layer while reducing the amount of etching of the regions corresponding to the etching protective layers.

In addition, from the above viewpoint, the width d1 of the opening portion Q in the arrangement direction (first direction) is preferably 1 µm to 10,000 µm and is more preferably 10 µm to 1,000 µm. Further, the distance d2 between the two etching protective layers 30*a* and 30*b* is preferably 1 µm to 1,000 µm and is more preferably 10 µm to 500 µm.

In the manufacturing method of the present invention, after the support forming step, the etching protective layers may be removed or the transistor may have the etching protective layers.

The manufacturing method of the present invention may further include an insulating layer removing step of removing the solid insulating layer at the position corresponding to the gap region G between the two semiconductor layer supports after the support forming step.

Figure 7:
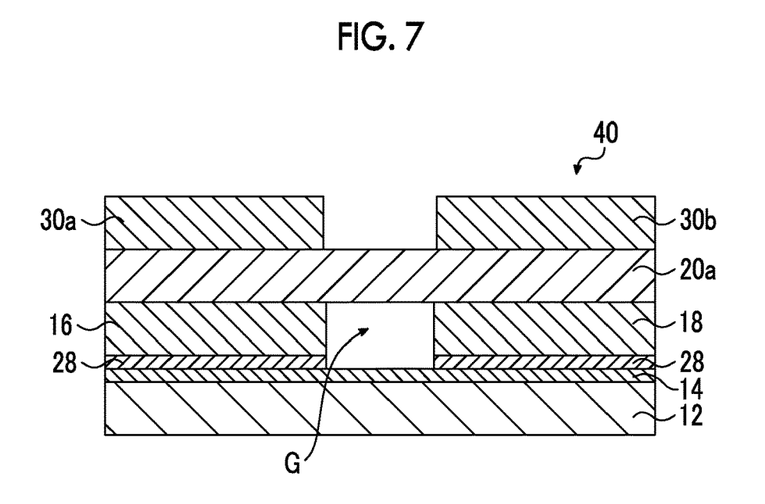
FIG. 7 is a schematic cross-sectional view showing another example of the thin film transistor prepared by the manufacturing method of a transistor of the present invention.

By removing a part of the solid insulating layer in the insulating layer removing step, as shown in FIG. 7, a transistor 40 is formed. In the transistor 40 shown in FIG. 7, the solid insulating layer 28 at the position corresponding to the gap region G is removed and the gate electrode layer 14 is in contact with the gap region G.

Accordingly, even in a case where a defect such as cracking is generated in the solid insulating layer, it is preferable to remove the solid insulating layer from the viewpoint that deterioration in transistor characteristics caused by the defect can be avoided.

On the other hand, in a case of the configuration in which the solid insulating layer 28 is provided between the gate electrode layer 14 and the gap region G as in the transistor 10 shown in FIG. 2B, since the solid insulating layer 28 is arranged between the gate electrode layer 14 and the semiconductor layer 20*a*, it is possible to increase a withstand voltage between the gate electrode layer 14 and the semiconductor layer 20*a* and it is possible to prevent a short circuit due to the contact between the gate electrode layer 14 and the semiconductor layer 20*a*. Thus, this case is preferable.

Figure 8:
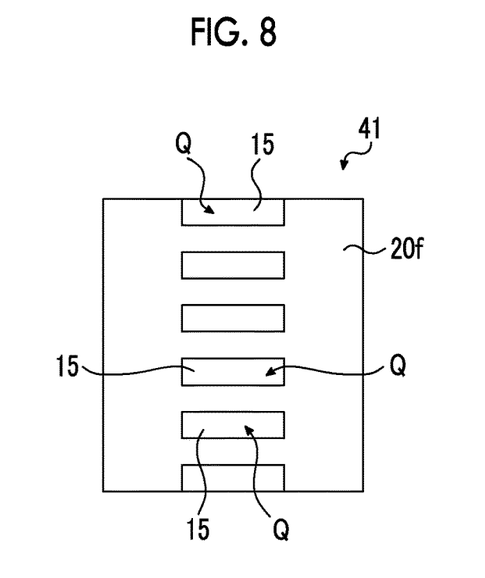
FIG. 8 is a schematic top view showing another example of the laminate in which opening portions are formed in the opening portion forming step.

In addition, in the above embodiment, the configuration in which the opening portions are formed so as to divide the semiconductor layer into a plurality of portions in the opening portion forming step is adopted. However, the embodiment is not limited thereto and as shown in a laminate 41 shown in FIG. 8, a semiconductor layer 20*f* may be formed as a single body having a plurality of opening portions Q. In the laminate 41, the plurality of opening portions Q are formed at the position corresponding to the region in which the support precursor layer is removed by etching in the case of the support forming step. In addition, as shown in FIG. 8, the plurality of opening portions Q are formed to be arranged in the first direction.

Further, in the above embodiment, the configuration in which one transistor is formed on one substrate is adopted. However, the embodiment is not limited thereto and may adopt a configuration in which a plurality of transistors are formed on one substrate.

In addition, a wiring is connected to each electrode in the transistor. Each wiring may be formed on the substrate as a wiring layer or each wiring may be connected to each electrode by appropriately providing through holes.

As described above, the transistor and the manufacturing method of a transistor of the present invention have been described in detail, but the present invention is not limited to the examples described above, and it is apparent that various improvements or changes are performed in a range not departing from the scope of the present invention.

EXAMPLES

Hereinafter, the present invention will be described in more detail on the basis of examples. Materials, use amounts, ratios, treatment contents, treatment sequences, and the like of the following examples are able to be suitably changed unless the changes cause deviance from the gist of the present invention. Accordingly, the range of the present invention will not be restrictively interpreted by the following examples.

Example 1

<Preparation of Thin Film Transistor>
(Preparation Step)

Alkali-free glass having a thickness of 0.7 mm and a size of 50 mm×50 mm (EAGLE XG, manufactured by Corning Incorporated) was used as the substrate 12.

Chrome (Cr: 0.01 µm thickness) and silver (Ag: 0.04 µm thickness) were sequentially vacuum-vapor deposited on the alkali-free glass substrate 12 by using a general vacuum vapor deposition apparatus to form the gate electrode layer 14.

Next, an aluminum oxide ($AlO_x$: 0.2 µm thickness) film was formed on the Gate electrode layer 14 as the solid insulating layer 28 by high frequency magnetron sputtering using a general high frequency magnetron sputtering apparatus.

Further, a gold film (Au: 1 µm thickness) was formed on the solid insulating layer 28 as the support precursor layer 15 by using a general sputtering apparatus to prepare the laminate 11a.

(Semiconductor Layer Forming Step)

A semiconductor layer (1 µm thickness) was formed on the support precursor layer 15 of the prepared laminate 11a.

Specifically, as shown in FIG. 3B, a wedged solution adsorption portion was formed by combining the glass piece 50 having a thickness of 0.7 mm and a spacer 51 having a height of 0.7 mm made of glass, the following coating solution was injected into the solution adsorption portion, and the coating solution was formed into a film on the tip end side of the solution adsorption portion and dried for half a day to form the semiconductor layer 20. Thus, the laminate 11b was prepared.

The coating, solution of the semiconductor layer 20 was prepared by mixing 2 wt % of 6,13-bis(triisopropyl silyl ethynyl) pentacene (TIPS pentacene) in toluene used as a solvent.

The size of the semiconductor layer 20 was set to a width of 5 mm×a depth of 15 mm.

(Opening Portion Forming Step)

Next, by using a laser processing machine, the semiconductor layer 20 of the laminate 11b was irradiated with an ultraviolet pulse laser (wavelength: 266 nm) and the semiconductor layer 20 was removed at a pitch of 20 µm to form the opening portions Q. In addition, the outer peripheral portion of the semiconductor layer 20 was also removed by irradiation with the laser. Accordingly, ten semiconductor layers 20a each having a size of a width of 20 µm×a length of 1,000 µm were formed to prepare the laminate 11c.

The formation pattern of the opening portions Q was set to Pattern A.

(Protective Layer Forming Step)

A shadow mask having two opening portions each having a size of a width of 0.5 mm×a depth of 1 mm spaced at an interval of 50 µm was overlapped on the plurality of semiconductor layers 20a of the laminate 11c and the etching protective layers 30a and 30b each having a thickness of 1 µm were formed on the semiconductor layers 20a by using a general high frequency sputtering apparatus to prepare the laminate 11d.

The high frequency sputtering was performed by targeting silicon nitride and introducing an Ar gas and an $N_2$ gas in an atmosphere at a degree of vacuum of 0.1 Pa.

(Support Forming Step)

Next, a part of the support precursor layer 15 of the laminate 11d was removed by performing etching to form two semiconductor layer supports.

Specifically, the laminate 11d was immersed in an Au etching solution (AURUM-304, manufactured by KANTO CHEMICAL CO., INC.) for 5 minutes and then was washed by being immersed in pure water for half a day. The laminate was further immersed in a hydrofluoroether-alcohol mixed solvent (Novec 71IPA, manufactured by 3M Japan Limited) for 10 minutes and then was dried naturally. Furthermore, vacuum drying was performed for a day.

Accordingly, the support precursor layer 15 corresponding to the region between the two etching protective layers 30a and 30b was removed and two semiconductor layer supports and the gap region G were formed to prepare the transistor 10.

Example 2

A transistor was prepared in the same manner as in Example 1 except that the etching step in the support forming step was changed.

Specifically, the laminate 11d was immersed in the Au etching solution (AURUM-304, manufactured by KANTO CHEMICAL CO., INC.) for 5 minutes. Next, the laminate was immersed in an aqueous solution of tetramethyl ammonium hydroxide (TMAH: 2.38%) for 2 hours and then washed by being immersed in pure water for half a day. The laminate was further immersed in a hydrofluoroether-alcohol mixed solvent (Novec 71IPA, manufactured by 3M Japan Limited) for 10 minutes and then was dried naturally. Furthermore, vacuum drying was performed for a day.

As a result, the support precursor layer 15 and the solid insulating layer 28 corresponding to the region between the two etching protective layers 30a and 30b were removed and thus the transistor 40 as shown in FIG. 7 was prepared. That is, the insulating layer removing step was provided.

Example 3

A transistor was prepared in the same manner as in Example 1 except that in the opening portion forming step, the shape of the opening portion Q to be formed was changed to a shape shown in FIG. 8. In this case, the formation pattern of the opening portions Q is set to Pattern B.

The number of opening portions Q was set to 10 and the size of the opening portion was set to 20 μm×100 μm. In addition, the outer peripheral portion of the semiconductor layer 20f was also removed by irradiation with a laser and the size of the entire semiconductor layer 20f was set to a width of 1 mm×a depth of 0.4 mm.

Comparative Example 1

A transistor was prepared in the same manner as in Example 1 except that in the opening portion forming step, the outer peripheral portion of the semiconductor layer 20 was irradiated with an ultraviolet laser and the semiconductor layer 20 having a width of 200 μm without the opening portions Q was formed.

However, in the support forming step, the support precursor layer corresponding to the region between the two etching protective layers could not be fully removed and the gap region G could not be formed. That is, the source electrode and the drain electrode were electrically connected and were short-circuited.

Comparative Example 2

A part of the support precursor layer in the laminate 11a prepared in the preparation step was removed by photolithography and etching to form two semiconductor layer supports and a space (gap region G) having a width of 50 μm between the two semiconductor layer supports.

On the other hand, a semiconductor layer was formed on a temporary support and the semiconductor layer was peeled off from the temporary support and the semiconductor layer was attached onto the two semiconductor layer supports such that that semiconductor layer was bridged over the gap region G. Thus, a transistor was prepared.

As the temporary support in the case of forming the semiconductor layer, a support obtained by forming a paraxylylene resin film (PARYLENE N: 1 μm thickness, manufactured by Specialty Coating Systems, Inc.) on the alkali-free glass by CVD and subjecting the film to an ultraviolet ozone treatment was used.

The formation method of the semiconductor layer on the temporary support was the same as the semiconductor layer forming step of Example 1 and after the semiconductor layer was formed, the semiconductor layer was scanned with an ultraviolet pulse laser, and thus a semiconductor layer having a width of 200 μm was prepared.

In the case where the semiconductor layer was peeled off from the temporary support, the paraxylylene resin was peeled off from the alkali-free glass while immersing in hydrofluoroether (Novec 7100, manufactured by 3M Japan Limited). Thus, the semiconductor crystal layer was detached from the paraxylylene resin.

In the case where the peeled-off semiconductor layer was attached onto the semiconductor layer supports, a conductive resin (DOTITE D-550, manufactured by FUJIKURA KASEI CO., LTD.) was attached to a tip end of an Au wire (25 μm diameter.) and then the semiconductor layer was picked and was attached onto the semiconductor layer supports.

Comparative Example 3

A transistor was prepared in the same manner as in Comparative Example 2 except that the semiconductor layer formed on the temporary support was scanned with an ultraviolet pulse laser to prepare ten semiconductor layers having a width of 20 μm and the semiconductor layer was attached onto the two semiconductor layer supports so as to be bridged.

The interval between the semiconductor layers was set to 20 μm.

(Evaluation)
<Transistor Characteristics>

Each electrode of the prepared transistor was connected to each terminal of a manual prober was connected to 4155C manufactured by Agilent Technologies and drain current-gate voltage ($I_d$–$V_g$) properties were measured to calculate the field effect mobility.

In each of Examples and Comparative Examples, 10 transistors were measured and the average value and the standard deviation thereof were calculated to calculate a range of the average value±the standard deviation.

The results are shown in Table 1.

TABLE 1

| | Step | | | | Evaluation |
|---|---|---|---|---|---|
| | Semiconductor layer forming step | Opening portion forming step | Support forming step | Insulating layer removing step | Field effect mobility range of average value ± standard deviation cm2/V · s |
| Example 1 | Provided | Pattern A | Provided | Not provided | 10-2 to 10-1 |
| Example 2 | Provided | Pattern A | Provided | Provided | 10-2 to 10-1 |
| Example 3 | Provided | Pattern B | Provided | Not provided | 10-2 to 10-1 |
| Comparative Example 1 | Provided | Not provided | Could not be formed | Not provided | — |
| Comparative Example 2 | Separately formed | Not provided | Formed in advance | Not provided | 10-4 to 10-2 |
| Comparative Example 3 | Separately formed | Not provided | Formed in advance | Not provided | 10-5 to 10-3 |

From Table 1, it is found that in the transistors of Examples 1 to 3 each prepared by the manufacturing method of the present invention including forming the semiconductor layer on the support precursor layer which became the semiconductor layer supports, removing a part of the semiconductor layer to form the opening portions, bringing the etchant into contact with the support precursor layer through the opening portions to remove a part of the support precursor layer, and forming the two semiconductor layer supports, compared to the transistors of Comparative Examples 1 to 3, the field effect mobility was high. That is, it was found that in Examples 1 to 3, the transistor characteristics were good.

From the result of Comparative Example 1, in the case where after the semiconductor layer was formed on the support precursor layer, the support precursor layer was etched without performing the opening portion forming step, the support precursor layer could not be appropriately etched and thus a transistor could not be prepared.

As in Comparative Examples 2 and 3, the method of separately forming the semiconductor layer and attaching the semiconductor layer onto the semiconductor layer supports required labor for alignment and the productivity was deteriorated.

From the above description, the effect of the present invention is apparent.

EXPLANATION OF REFERENCES 10, 40: transistor
11a: laminate
11b: laminate in which semiconductor layer is laminated
11c, 41: laminate in which opening portions are formed
11d: laminate in which protective layer is formed
12: substrate
14: gate electrode layer
15: support precursor layer
16: source electrode
18: drain electrode
20, 20a, 20f: semiconductor layer
28: solid insulating layer
30a, 30b: etching protective layer
50: glass piece
51: spacer
G: gap region
Q: opening portion

What is claimed is:

1. A manufacturing method of a transistor, comprising:
   a preparation step of preparing a laminate in which a gate electrode layer, a solid insulating layer, and a support precursor layer are laminated on a substrate in this order;
   a semiconductor layer forming step of forming a semiconductor layer on an upper surface of the support precursor layer of the laminate;
   an opening portion forming step of forming one or more opening portions from which the support precursor layer is exposed by removing a part of the semiconductor layer;
   a protective layer forming step of forming two etching protective layers on the semiconductor layer such that the two etching protective layers are separated from each other and at least a part of the opening portion is positioned in a region between the two etching protective layers; and
   a support forming step of removing a part of the support precursor layer by bringing a liquid or a gas that can etch the support precursor layer into contact with the support precursor layer through the opening portions between the two etching protective layers, thereby forming a space at a position corresponding to the region between the two etching protective layers so as to form two semiconductor layer supports that are arranged with the space interposed therebetween.

2. The manufacturing method of a transistor according to claim 1,
   wherein the support precursor layer is formed of a metal or a metal oxide.

3. The manufacturing method of a transistor according to claim 1,
   wherein the two semiconductor layer supports formed in the support forming step are a source electrode and a drain electrode.

4. The manufacturing method of a transistor according to claim 2,
   wherein the two semiconductor layer supports formed in the support forming step are a source electrode and a drain electrode.

5. The manufacturing method of a transistor according to claim 1,
   wherein in the opening portion forming step, two or more opening portions are formed to be arranged in one direction,
   in the protective layer forming step, two etching protective layers that extend in the arrangement direction of the two or more opening portions are formed to be separated from each other in a direction orthogonal to the arrangement direction of the two or more opening portions, and
   in the support forming step, the two semiconductor layer supports are formed by removing the support precursor layer at a position corresponding to a region in which the two or more opening portions are arranged between the two etching protective layers and forming the space.

6. The manufacturing method of a transistor according to claim 4,
   wherein in the opening portion forming step, two or more opening portions are formed to be arranged in one direction,
   in the protective layer forming step, two etching protective layers that extend in the arrangement direction of the two or more opening portions are formed to be separated from each other in a direction orthogonal to the arrangement direction of the two or more opening portions, and
   in the support forming step, the two semiconductor layer supports are formed by removing the support precursor layer at a position corresponding to a region in which the two or more opening portions are arranged between the two etching protective layers and forming the space.

7. The manufacturing method of a transistor according to claim 1,
   wherein in the opening portion forming step, the semiconductor layer is divided into a plurality of portions arranged in one direction, and the opening portion is formed between the divided semiconductor layers.

8. The manufacturing method of a transistor according to claim 6,
   wherein in the opening portion forming step, the semiconductor layer is divided into a plurality of portions arranged in one direction, and the opening portion is formed between the divided semiconductor layers.

9. The manufacturing method of a transistor according to claim 1,
   wherein in the semiconductor layer forming step, a coating solution which becomes the semiconductor layer is applied to the upper surface of the support precursor layer of the laminate, and is dried to form the semiconductor layer.

10. The manufacturing method of a transistor according to claim 8, wherein in the semiconductor layer forming step, a coating solution which becomes the semiconductor layer is applied to the upper surface of the support precursor layer of the laminate, and is dried to form the semiconductor layer.

11. The manufacturing method of a transistor according to claim 1,
wherein in the opening portion forming step, a part of the semiconductor layer is removed by laser processing.

12. The manufacturing method of a transistor according to claim 10,
wherein in the opening portion forming step, a part of the semiconductor layer is removed by laser processing.

13. The manufacturing method of a transistor according to claim 1, further comprising:
an insulating layer removing step of removing the solid insulating layer at a position corresponding to the space between the two semiconductor layer supports, after the support forming step.

14. The manufacturing method of a transistor according to claim 12, further comprising:
an insulating layer removing step of removing the solid insulating layer at a position corresponding to the space between the two semiconductor layer supports, after the support forming step.

15. A transistor, comprising:
a substrate;
a gate electrode layer that is laminated on the substrate;
a solid insulating layer that is laminated on the gate electrode layer;
two semiconductor layer supports that are laminated on the solid insulating layer; and
a plurality of semiconductor layers that are laminated on the two semiconductor layer supports,
wherein the plurality of semiconductor layers are arranged to be separated from each other in a first direction and an opening portion is formed between the plurality of semiconductor layers, and
the two semiconductor layer supports are arranged to be separated from each other in a second direction orthogonal to the first direction and a gap region is formed between the semiconductor layer and the solid insulating layer and between the two semiconductor layer supports.

* * * * *